(12) United States Patent
Kim

(10) Patent No.: US 11,935,592 B2
(45) Date of Patent: Mar. 19, 2024

(54) RESISTIVE MEMORY DEVICE FOR WRITING DATA AND OPERATING METHOD THEREOF

(71) Applicant: Samsung Electronics Co., Ltd., Suwon-si (KR)

(72) Inventor: Chankyung Kim, Osan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 79 days.

(21) Appl. No.: 17/328,248

(22) Filed: May 24, 2021

(65) Prior Publication Data

US 2022/0084591 A1 Mar. 17, 2022

(30) Foreign Application Priority Data

Sep. 14, 2020 (KR) .................. 10-2020-0117772

(51) Int. Cl.
*G11C 13/00* (2006.01)

(52) U.S. Cl.
CPC ...... *G11C 13/0069* (2013.01); *G11C 13/0026* (2013.01); *G11C 13/0028* (2013.01); *G11C 13/0038* (2013.01); *G11C 13/004* (2013.01); *G11C 2013/0054* (2013.01)

(58) Field of Classification Search
CPC ............ G11C 13/0069; G11C 13/0026; G11C 13/0028; G11C 13/0038; G11C 13/004; G11C 2013/0054; G11C 8/08; G11C 7/04; G11C 11/1657; G11C 11/1673; G11C 11/1675; G11C 13/0021; G06F 3/0659
See application file for complete search history.

(56) References Cited

U.S. PATENT DOCUMENTS

| 6,101,126 | A  | * | 8/2000  | Chung .................. G11C 16/12 365/189.11 |
| 6,363,000 | B2 | * | 3/2002  | Perner .................... G11C 11/15 365/66 |
| 7,764,536 | B2 |   | 7/2010  | Luo et al. |
| 7,821,819 | B2 | * | 10/2010 | Hachino ................ G11C 11/15 365/158 |
| 7,916,515 | B2 |   | 3/2011  | Li et al. |
| 8,325,542 | B2 | * | 12/2012 | Ogura ................. G11C 11/5642 365/202 |
| 8,570,787 | B2 |   | 10/2013 | Kitagawa et al. |

(Continued)

FOREIGN PATENT DOCUMENTS

JP 2011-023046 A 2/2011

*Primary Examiner* — Khamdan N. Alrobaie
(74) *Attorney, Agent, or Firm* — Harness, Dickey & Pierce, P.L.C.

(57) ABSTRACT

A resistive memory device includes a resistive cell connected between a first bit line and a first source line, a reference cell including a reference resistor and connected between a second bit line and a second source line, and a write driver connected to the first bit line or the first source line, connected to the second bit line or the second source line. The write driver includes a comparator configured to compare previous data written in the resistive cell with the target data by comparing a voltage of the first source line with a voltage of the second source line or comparing a voltage of the first bit line with a voltage of the second bit line, and determine whether the target data is written in the resistive cell after comparing the previous data with the target data.

19 Claims, 18 Drawing Sheets

(56) References Cited

U.S. PATENT DOCUMENTS

| | | | |
|---|---|---|---|
| 8,693,238 B2 | 4/2014 | Sakimura et al. | |
| 9,001,560 B2* | 4/2015 | Lee | G11C 13/0064 |
| | | | 365/189.16 |
| 9,460,785 B2 | 10/2016 | Ogiwara et al. | |
| 9,672,886 B2 | 6/2017 | Wang et al. | |
| 10,062,445 B2* | 8/2018 | Hunt-Schroeder | G11C 8/14 |
| 2009/0040816 A1* | 2/2009 | Kang | G11C 13/0004 |
| | | | 365/163 |
| 2009/0147559 A1* | 6/2009 | Lee | G11C 11/4091 |
| | | | 365/189.15 |
| 2016/0125927 A1* | 5/2016 | Wei | G11C 13/0011 |
| | | | 365/158 |
| 2017/0032840 A1* | 2/2017 | Matsuoka | G11C 11/1655 |
| 2020/0090722 A1 | 3/2020 | Lee et al. | |

* cited by examiner

V_ref --------------

| INFORMATION WRITTEN IN TARGET CELL | VIN | VINB | VOUT | DIN | VWRITE |
|---|---|---|---|---|---|
| 0 (Parallel) | LOW VOLTAGE | HIGH VOLTAGE | LOGIC LOW | 0 | 0 |
| 0 (Parallel) | LOW VOLTAGE | HIGH VOLTAGE | LOGIC LOW | 1 | 1 |
| 1 (Anti Parallel) | HIGH VOLTAGE | LOW VOLTAGE | LOGIC HIGH | 0 | 1 |
| 1 (Anti Parallel) | HIGH VOLTAGE | LOW VOLTAGE | LOGIC HIGH | 1 | 0 |

RESISTIVE MEMORY DEVICE FOR WRITING DATA AND OPERATING METHOD THEREOF

CROSS-REFERENCE TO RELATED APPLICATION

This application is based on and claims priority under 35 U.S.C. § 119 to Korean Patent Application No. 10-2020-0117772, filed on Sep. 14, 2020, in the Korean Intellectual Property Office, the disclosure of which is incorporated by reference herein in its entirety.

BACKGROUND

The inventive concepts relate to a resistive memory device, and more particularly, to a resistive memory device for writing data and an operating method thereof.

Magnetic random access memory (MRAM) having a memory function on the basis of a resistance change according to a polarity change of a magnetic substance has been developed. Spin torque transfer-magnetic random access memory (STT-MRAM) is a universal memory device having the advantages of lower cost and/or higher capacity of dynamic RAM (DRAM), the operation speed of static RAM (SRAM), and non-volatility of flash memory.

Unlike DRAM or SRAM, which are charge-based memory, MRAM, which is a type of resistance-based memory, requires a larger write current, and thus, an operational load to perform a write operation is larger.

SUMMARY

The inventive concepts relate to a resistive memory device for writing data, which performs a verification operation of comparing data written in a memory cell with target data by using a write current in order to reduce energy required for writing data, and an operating method of the resistive memory device.

The inventive concepts relate to a resistive memory device for writing data, which reduces driving power while reducing an area of a write driver and compensates for a temperature of a resistive memory cell, and an operating method of the resistive memory device.

According to an aspect of the inventive concepts, there is provided a resistive memory device including a resistive memory cell connected between a first bit line and a first source line, a reference cell including a reference resistor and connected between a second bit line and a second source line, and a write driver connected to the first bit line or the first source line, connected to the second bit line or the second source line, and configured to generate a write current for writing target data in the resistive memory cell. The write driver includes a comparator configured to generate receive the write current, compare previous data written in the resistive memory cell with the target data by comparing a voltage of the first source line with a voltage of the second source line or comparing a voltage of the first bit line with a voltage of the second bit line, and determine whether the target data is written in the resistive memory cell in accordance with a result of comparing the previous data with the target data.

According to an aspect of the inventive concepts, there is provided a method of driving a resistive memory device, the method including receiving a write command for writing target data in a resistive memory cell connected between a first bit line and a first source line from a memory controller, generating a write current in accordance with the write command, receiving the write current and comparing previous data written in the resistive memory cell with the target data by comparing a voltage of the first source line with a voltage of a second source line or comparing a voltage of the first bit line with a voltage of a second bit line, and determining whether the target data is written in the resistive memory cell in accordance with a result of comparing the previous data with the target data. The second source line is a source line of a reference cell including a reference resistor and the second bit line is a bit line of the reference cell.

According to an aspect of the inventive concepts, there is provided a resistive memory device including a level shifter connected to a word line of a resistive memory cell connected between a first bit line and a first source line, receiving a word line selection voltage, and outputting a first voltage higher than a power supply voltage of the memory device, a word line driver including a first word line driver module connected to the first source line and a second word line driver module connected to the first bit line and providing a second voltage higher than the first voltage to a word line of the resistive memory cell, and a boosted capacitor of which one end is connected to the level shifter and the first word line driver module and of which the other end is connected to the second word line driver module.

BRIEF DESCRIPTION OF THE DRAWINGS

Example embodiments of the inventive concepts will be more clearly understood from the following detailed description taken in conjunction with the accompanying drawings in which:

FIGS. 2A and 2B are conceptual diagrams illustrating operation examples of a memory device according to example embodiments of the inventive concepts;

FIG. 7 is an example diagram illustrating an operation of a comparator according to example embodiments of the inventive concepts;

DETAILED DESCRIPTION OF EXAMPLE EMBODIMENTS

Hereinafter, example embodiments of the inventive concepts will be described in detail with reference to the accompanying drawings.

Figure 1:
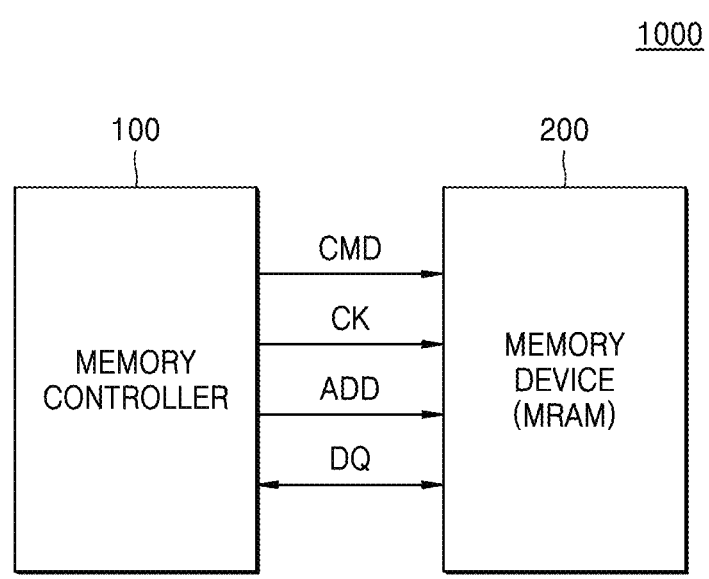
FIG. 1 is a block diagram illustrating a memory system according to example embodiments of the inventive concepts.

FIG. 1 is a block diagram illustrating a memory system 1000 according to example embodiments of the inventive concepts.

Referring to FIG. 1, the memory system 1000 includes a memory controller 100 and a memory device 200.

The memory controller 100 may transmit a command signal CMD, a clock signal CLK, and/or an address signal ADD to the memory device 200 or may transmit and receive data DATA.

According to example embodiments, the memory device 200 as non-volatile memory may be magnetic random access memory (MRAM) including a magnetic memory cell and may include a spin torque transfer-magnetic random access memory (STT-MRAM) cell. The STT-MRAM cell may include a selection transistor and a variable resistance element, for example, a magnetic tunnel junction (MTJ) element having a magnetic material.

The memory controller 100 for controlling the MRAM may be implemented to be the same as or similar to, for example, a dynamic RAM (DRAM) controller for controlling DRAM. In addition, the memory system 1000 may have an interface the same as or similar to a DRAM interface.

Figure 2A:
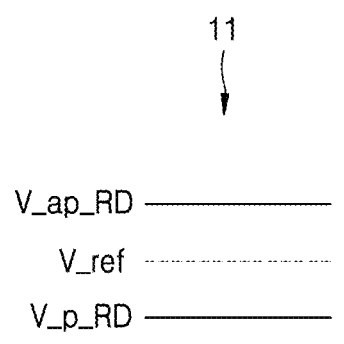
Figure 2B:
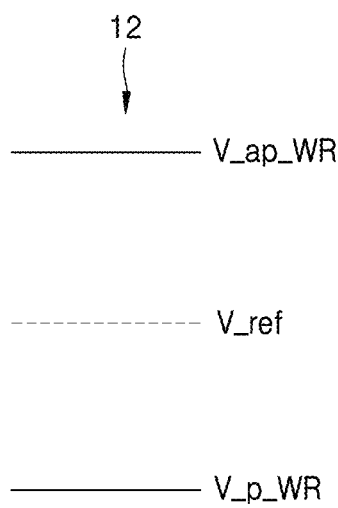

FIGS. 2A and 2B are a conceptual diagram illustrating an operation example of a memory device according to example embodiments of the inventive concepts.

Referring to FIGS. 2A and 2B, a magnitude of a voltage required for writing data in the STT-MRAM cell may be different from that of a voltage required for reading data from the STT-MRAM cell.

Reference numeral '11' denotes a voltage required for reading information written in the STT-MRAM cell and reference numeral '12' schematically denotes a magnitude of a voltage required for writing arbitrary data in the STT-MRAM cell. For example, based on a reference voltage V_ref, voltages V_ap_WR and V_p_WR required for writing data in a state in which the MTJ element is in a first state, for example, an antiparallel (AP) state may be greater than voltages V_ap_RD and V_p_RD required for reading data written in the MTJ element in the AP state no less than several times.

On the other hand, in the DRAM or the SRAM, a write operation in a random write method may be commonly performed. The random write method means that the write operation is performed in a state in which it is not known to the outside which information is actually written in a bit cell.

In the MRAM, unlike in the DRAM or the SRAM as charge-based memory, because a magnitude of a voltage required for a write operation is larger, it may be advantageous to previously check information written in the bit cell and to perform the write operation only when data written in the bit cell is different from target data (for example, DIN of FIG. 3) to be written in the bit cell.

For this purpose, in general, before performing the write operation, an operation of reading data from the bit cell may be previously performed, which may cause timing penalty, and a read current must be separately generated for the write operation in the memory device, which may be inconvenient.

Therefore, according to example embodiments of the inventive concepts, in order to reduce burden of the write operation of the memory device, a method of comparing data written in the STT-MRAM cell with the target data DIN and performing the write operation when the two data items are different from each other by using a write current I_WR generated by the write operation without previously performing the read operation is disclosed.

Figure 3:
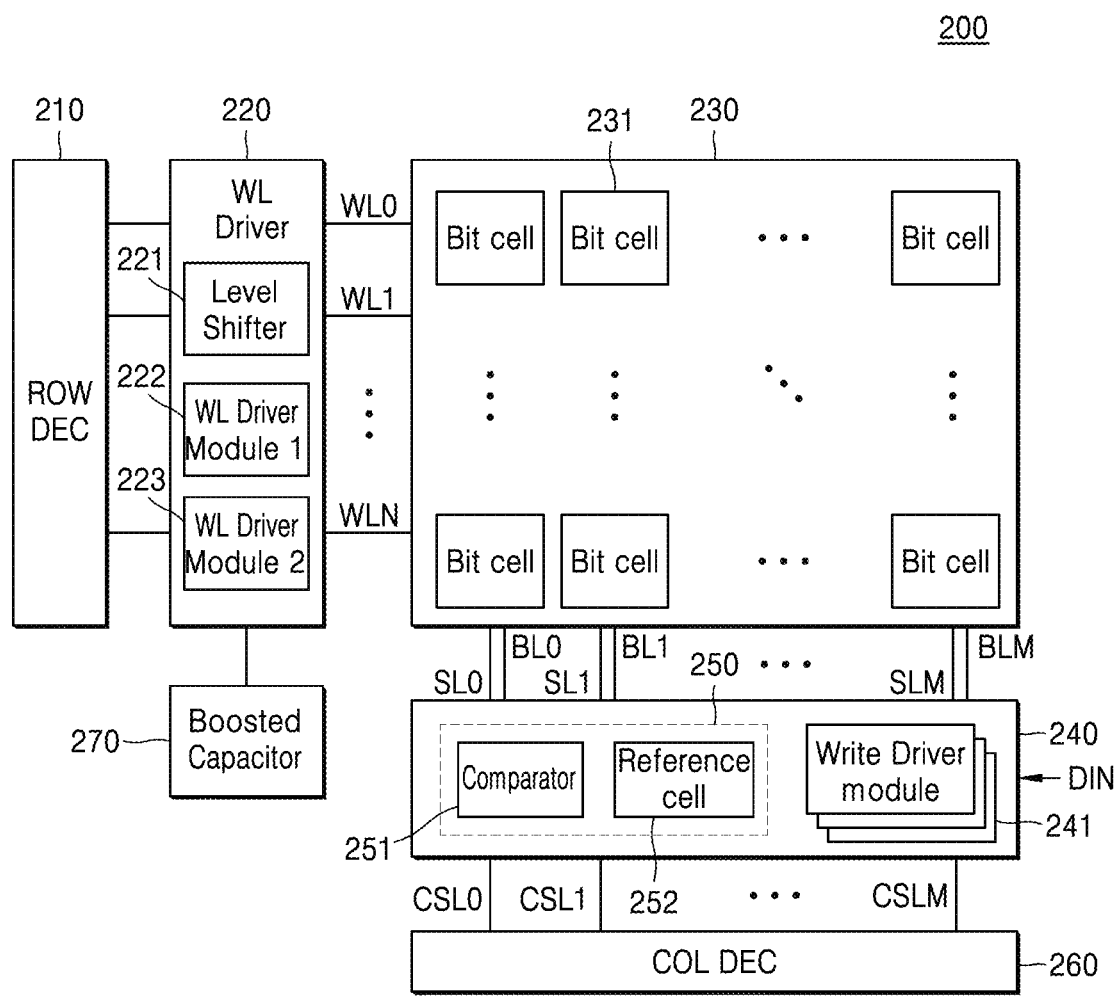
FIG. 3 is a block diagram illustrating a memory device according to example embodiments of the inventive concepts.

FIG. 3 is a block diagram illustrating a memory device according to example embodiments of the inventive concepts.

Referring to FIG. 3, each of a row decoder 210 and a column decoder 260 includes a plurality of switches. The row decoder 210 is switched in response to a row address and selects word lines and the column decoder 260 is switched in response to a column address and selects a plurality of bit lines BL0 to BLM.

A plurality of word lines WL0 to WLN are enabled by the row decoder 210 and are connected to a word line driver 220 driving a word line selection voltage. The word line selection voltage may activate the plurality of word lines WL0 to WLN in order to read data from or write data in a plurality of bit cells 231.

The word line driver 220 may output the word line selection voltage for selecting the plurality of word lines WL0 to WLN, a unit decoding the row address may be provided in the word line driver 220, or the decoded row address from the row decoder 210 may be provided to the word line driver 220.

The word line driver 220 according to example embodiments of the inventive concepts may include a plurality of level shifters 221 and/or first and second word line driver modules 222 and 223. The plurality of level shifters 221 and the first and second word line driver modules 222 and 223 may generate a word line driving voltage higher than a power supply voltage of the memory device 200.

In addition, because the word line driver 220 includes a level shifter 221 that is not an analog charge pump with a larger area, an area of the word line driver 220 may be reduced and, because the first and second word line driver modules 222 and 223 and a boosted capacitor 270 are used together with the level shifter 221, consumption of analog power used for generating the word line driving voltage may be reduced or minimized.

The word line driver 220 may be connected to the boosted capacitor 270. A capacitance value of the boosted capacitor 270 may be controlled in accordance with a temperature. Because the MTJ element of the MRAM is sensitive to a temperature, a compensation operation of flowing a higher current at a lower temperature and flowing a lower current at a higher temperature may be advantageous.

In order to compensate for the temperature, the boosted capacitor 270 may change the capacitance value by controlling the number of capacitor modules connected thereto in accordance with the temperature of the MTJ element. A structure and operation of the boosted capacitor 270 will be described in detail with reference to FIG. 15.

A memory cell array 230 includes the plurality of word lines WL0 to WLN (N is a natural number of no less than 1), the plurality of bit lines BL0 to BLM (M is a natural number of no less than 1), a plurality of source lines SL0 to SLN (N is a natural number of no less than 1), and the plurality of bit cells 231 arranged in an area in which the plurality of word lines WL0 to WLN intersect the plurality of bit lines BL0 to BLM. Hereinafter, in the current specification, a bit cell may be referred to as a memory cell. For example, the bit cell 231 may be implemented by the STT-MRAM cell.

Figure 5:
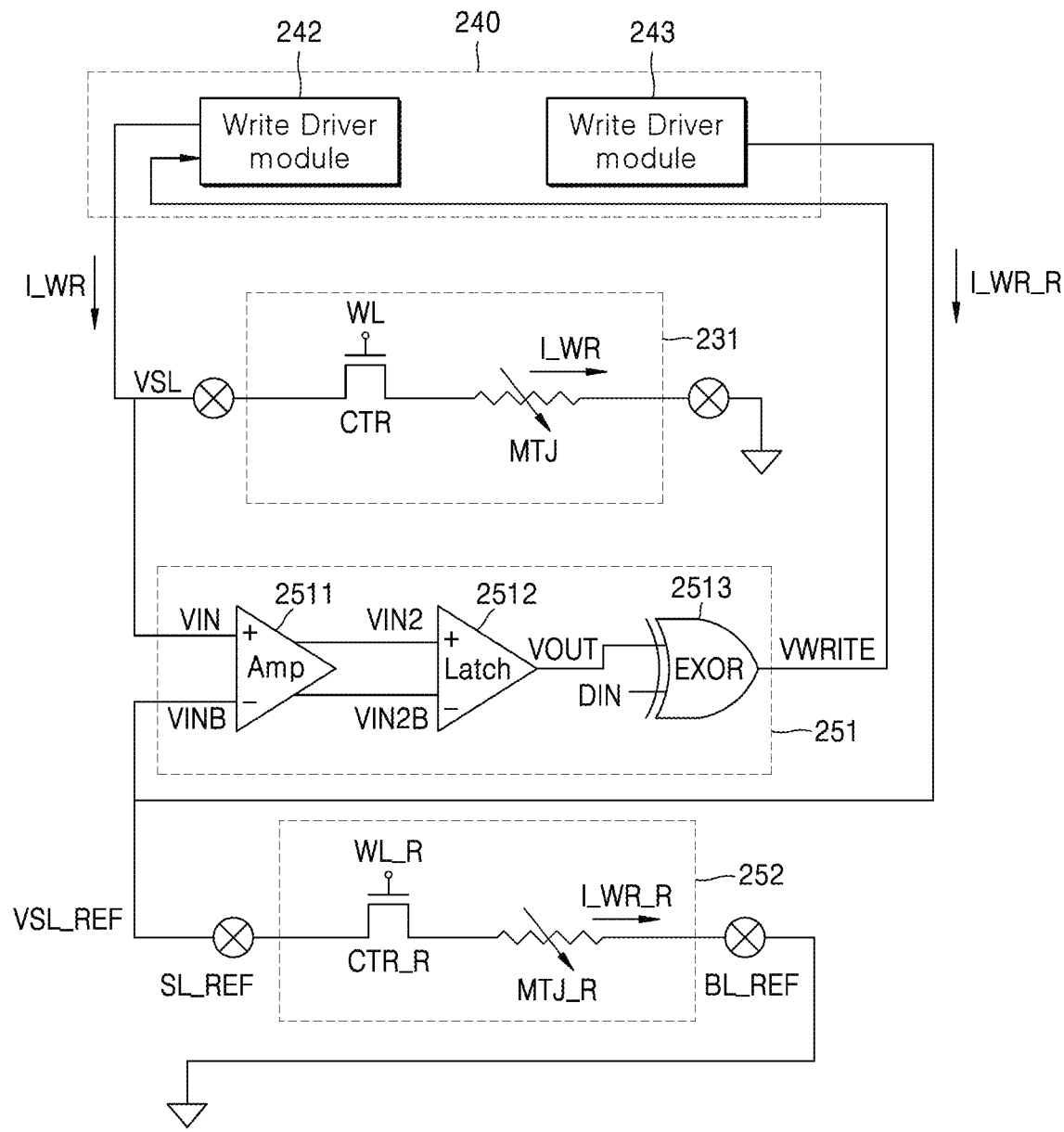
FIGS. 5 and 6 are circuit diagrams illustrating an operation example of a memory device according to example embodiments of the inventive concepts.

The bit cell 231 may include a selection transistor (for example, CTR of FIG. 5) and a variable resistance element (for example, MTJ of FIG. 5).

The selection transistor CTR is switched in response to a signal output from the word line driver 220. The selection transistor CTR may be referred to as a cell transistor.

The variable resistance element MTJ may be replaced by a resistive element such as phase change RAM (PRAM) using a phase change material, resistive RAM (RRAM) using a variable resistance material such as a complex metal oxide, or the MRAM using a ferromagnetic material.

For convenience sake, according to the inventive concepts, a state in which data 0 is written in the variable resistance element MTJ may be referred to as parallel or, P and a state in which data 1 is written in the variable resistance element MTJ may be referred to as anti-parallel or, AP. When the variable resistance element MTJ is in the P state, a magnitude of resistance may be less than that when the variable resistance element MTJ is in the AP state.

In addition, in the current specification, data to be written may be referred to as the target data DIN and a specific bit cell in which the target data DIN is to be written may be referred to as a target bit cell.

The plurality of source lines SL0 to SLN and the plurality of bit lines BL0 to BLM of the target bit cell 231 are connected to a write driver 240.

The write driver 240 may apply a current for performing the write operation to the target bit cell 231 in response to an external command. That is, the write driver 240 may write a logic value in the variable resistance element MTJ by applying a voltage to both ends of the target bit cell 231.

The write driver 240 may include a plurality of write driver modules 241. The plurality of write driver modules 241 may correspond to columns of the memory cell array 230, respectively. The plurality of write driver modules 241 may be connected to the plurality of source lines SL0 to SLN and the plurality of bit lines BL0 to BLM, respectively.

Each of the plurality of write driver modules 241 according to some example embodiments may include a p-channel metal oxide semiconductor (PMOS) transistor and an amplifier with a feedback structure. A detailed configuration of each of the plurality of write driver modules 241 will be described with reference to FIGS. 10A to 10C.

The write driver 240 according to example embodiments of the inventive concepts may include a verifier 250 including a comparator 251 and a reference cell 252. The comparator 251 may include an amplifier, a latch circuit, and/or an XOR gate. A structure of the reference cell 252 may be similar to that of the target bit cell 231.

The verifier 250 may be connected to a source line SL or a bit line BL of the target bit cell 231, a source line (for example, SL_REF of FIG. 5) or a bit line (for example, BL_REF of FIG. 5) of the reference cell 252, and the plurality of write driver modules 241. The verifier 250 may receive a current from the write driver 240 and may control generation of the write current I_WR of the write driver 240.

For example, when the write current I_WR is generated by the plurality of write driver modules 241 in accordance with a write command, the verifier 250 may receive a source line voltage of a target bit cell 231 in which data is to be written and a source line voltage of the reference cell 252. The verifier 250 may determine whether the data written in the target bit cell 231 is the same as the target data DIN by comparing one of the source line voltage of the target bit cell 231 and the source line voltage of the reference cell 252 with the target data DIN.

For example, the verifier 250 may determine whether a greater voltage between the source line voltage of the target bit cell 231 and the source line voltage of the reference cell 252 is the same as the target data DIN.

When it is determined that the written data is the same as the target data DIN, the verifier 250 may provide a signal blocking the write current I_WR to the plurality of write driver modules 241. When it is determined that the written data is different from the target data DIN, the verifier 250 may have the plurality of write driver modules 241 continuously provide the write current I_WR to the target bit cell 231 for a first period. For example, the first period may be required for writing the target data DIN in the MTJ element of the target bit cell 231.

On the other hand, the verifier 250 may be connected to 64 bit lines of the target bit cell 231. However, a connection relationship between the target bit cell 231 and the verifier 250 is not limited thereto.

The column decoder 260 may select one bit line by generating column selection signals CSL0 to CSLM.

The boosted capacitor 270 may control the capacitance value in accordance with a provided temperature compensation code (TCC). For example, the boosted capacitor 270 may turn on or off a plurality of capacitor modules in accordance with the TCC. The TCC may be obtained by compensating for a relationship between a temperature of the MTJ element and a driving voltage of the MTJ element and may be received from a separate module (not shown).

On the other hand, the memory device 200 may further include components that are not shown in FIG. 3.

Figure 4:
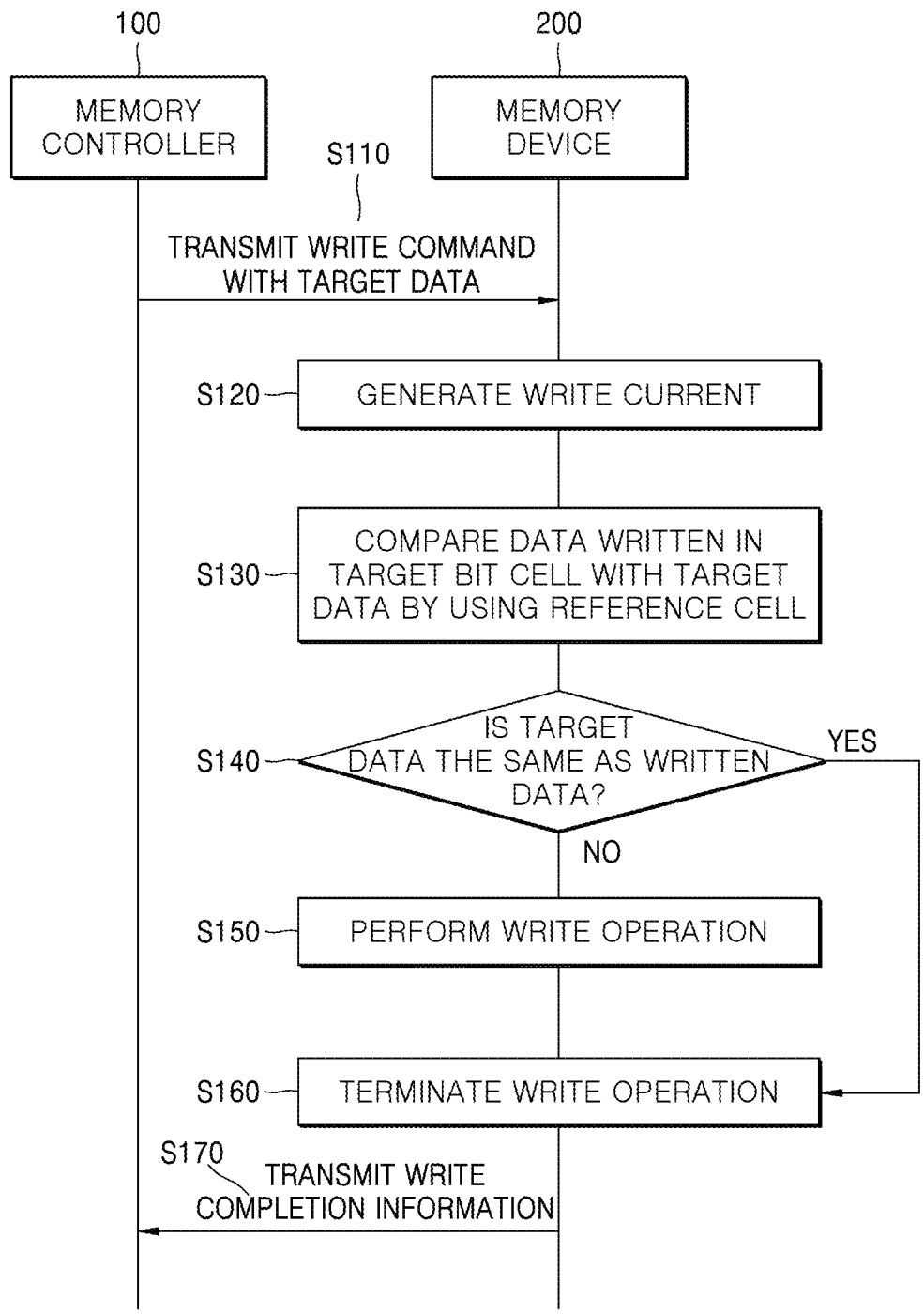
FIG. 4 is a flowchart illustrating an operating method of a memory system according to example embodiments of the inventive concepts.

FIG. 4 is a flowchart illustrating a method of operating a memory system according to example embodiments of the inventive concepts.

Referring to FIGS. 3 and 4, the memory controller 100 may transmit the write command and the target data DIN to the memory device 200 in operation S110.

The memory device 200 may generate the write current I_WR in order to perform the write operation in operation S120. For example, the write current I_WR generated by the write driver 240 may flow through the target bit cell 231. At this time, duration for which the write current I_WR flows through the target bit cell 231 may be less than duration for which the target data DIN is input to the target bit cell 231 so that the write operation is completed.

In the current disclosure, a method of determining whether the target data DIN is written in the target bit cell 231 based on the write current I_WR received for a short time before the write current I_WR is received to the target bit cell 231 for a sufficient time so that the target data DIN is written in the target bit cell 231 is disclosed.

The memory device 200 may compare the data written in the target bit cell 231 with the target data DIN to be written in the target bit cell 231 by using the reference cell 252 in operation S130. For example, the comparator 251 of the memory device 200 may be connected to the source line SL of the target bit cell 231 and the source line SL_REF of the reference cell 252.

At this time, when the write current I_WR is supplied from the write driver 240 to the target bit cell 231 and the reference cell 252, the comparator 251 may receive the source line voltage of the target bit cell 231 and the source line voltage of the reference cell 252. In addition, the comparator 251 may receive the target data DIN to be written in the target bit cell 231.

The comparator 251 may amplify the source line voltage of the target bit cell 231 and the source line voltage of the reference cell 252 and may compare a greater value between values of the two amplified voltages with the target data DIN.

The comparator 251 may compare the previous data written in the target bit cell 231 with the target data DIN by comparing a voltage of the source line SL of the target bit cell 231 with a voltage of the source line SL_REF of the reference cell 252 or comparing a voltage of the bit line BL of the target bit cell 231 with a voltage of the bit line BL_REF of the reference cell 252 and may determine whether the target data DIN is written in the target bit cell 231 in accordance with the result of comparing the previous data with the target data DIN.

The memory device 200 may determine whether the data previously written in the target bit cell 231 is the same as the target data DIN in operation S140.

In the above example, the greater voltage between the source line voltage of the target bit cell 231 and the source line voltage of the reference cell 252 is converted into a logic low or high digital signal and, when the converted signal is the same as the target data DIN, the verifier 250 may determine that the data previously written in the target bit cell 231 is the same as the target data DIN.

In another example, the greater voltage between the source line voltage of the target bit cell 231 and the source line voltage of the reference cell 252 is converted into the logic low or high digital signal and, when the converted signal is different from the target data DIN, the verifier 250 may determine that the data previously written in the target bit cell 231 is different from the target data DIN.

When it is determined in operation S140 that the data previously written in the target bit cell 231 is different from the target data DIN, the memory device 200 may write the target data DIN in the target bit cell 231 in operation S150. For example, the comparator 251 may have the write driver 240 continuously flow the write current I_WR to the target bit cell 231. After the write operation is completed, the memory device 200 may terminate the write operation in operation S160.

When it is determined in operation S140 that the data previously written in the target bit cell 231 is the same as the target data DIN, the memory device 200 may terminate the write operation in operation S160. For example, the comparator 251 may reduce or prevent the write driver 240 from applying the write current I_WR to the target bit cell 231.

After the write operation is terminated, the memory device 200 may transmit write completion information to the memory controller 100 in operation S170.

Figure 6:
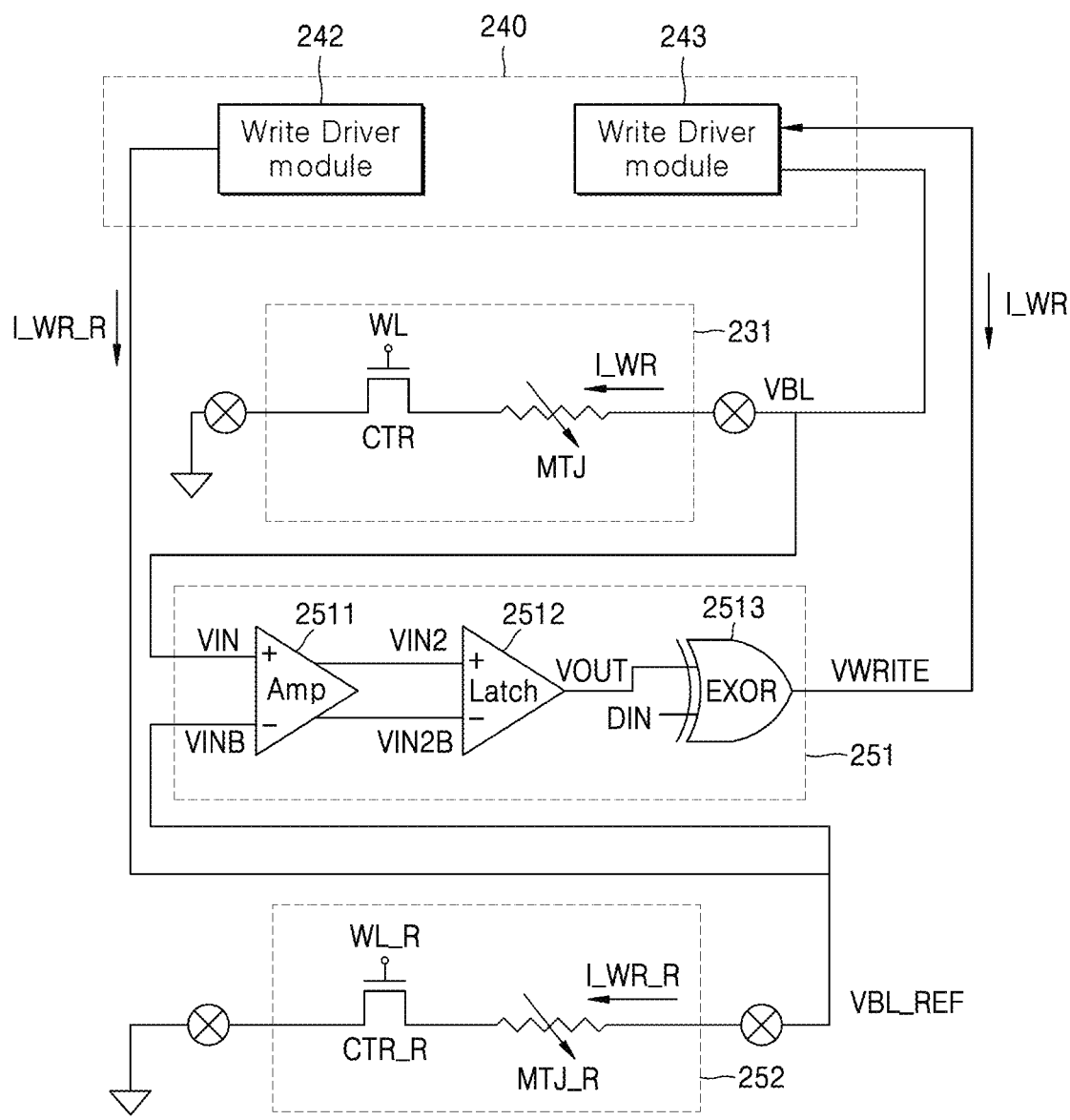

FIGS. 5 and 6 are circuit diagrams illustrating an operation example of a memory device according to example embodiments of the inventive concepts. FIG. 7 is an example diagram illustrating an operation of a comparator 251 according to example embodiments of the inventive concepts.

The comparator 251 may include an amplifier 2511, a latch circuit 2512, and/or an exclusive OR (XOR) gate 2513.

A voltage value of the source line SL of the target bit cell 231 may be referred to as a source line voltage VSL and a voltage value of the bit line BL of the target bit cell 231 may be referred to as a bit line voltage VBL. In addition, a voltage value of the source line SL_REF of the reference cell 252 may be referred to as a source line voltage VSL_REF and a voltage value of the bit line BL_REF of the reference cell 252 may be referred to as a bit line voltage VBL_REF.

The comparator 251 may receive one of the source line voltage VSL and the bit line voltage VBL of the target bit cell 231, one of the source line voltage VSL_REF and the bit line voltage VBL_REF of the reference cell 252, and the target data DIN.

The comparator 251 may determine whether the data written in the target bit cell 231 is the same as the target data DIN by comparing one of the received voltage values with the target data DIN. An output VWRITE of the comparator 251 may be connected to the write driver 240 and may maintain or block the flow of the write current I_WR to the target bit cell 231.

The reference cell 252 may have a structure similar to that of the target bit cell 231 and may include a selection transistor CTR_R and a reference resistor MTJ_R. The reference resistor MTJ_R of the reference cell 252 may have an interval value between a resistance value when the variable resistance element MTJ of the target bit cell 231 is in the P state and a resistance value when the variable resistance element MTJ of the target bit cell 231 is in the AP state. The reference cell 252 may receive a write current I_WR_R from the write driver 240.

For example, the write driver 240 may write data in the variable resistance element MTJ by applying the bidirectional write current I_WR to the variable resistance element MTJ based on the target bit cell 231. That is, the write driver 240 may generate the write current I_WR for writing the target data DIN in the target bit cell 231.

The write driver 240 may include first and second write driver modules 242 and 243. For example, the first write driver module 242 may be connected to the source line SL of the target bit cell 231 and the second write driver module 243 may be connected to the bit line BL of the target bit cell 231. Each of the first and second write driver modules 242 and 243 may correspond to the write driver module 241 of FIG. 3 and may be one embodiment of the write driver module 241.

For example, when the variable resistance element MTJ of target bit cell 231 is in the P state, in which the data 0 is written, and the data 1 is written in order to change the variable resistance element MTJ of target bit cell 231 to be in the AP state, the write current I_WR must be applied from the source line SL to the bit line BL of the variable resistance element MTJ of target bit cell 231. The first write driver module 242 is turned on and current sink in the bit line BL is turned on so that a current may be formed from the source line SL to the bit line BL of the target bit cell 231 in accordance with a voltage of the first write driver module 242. The current sink may mean an element grounding the write current I_WR flowing through the target bit cell 231.

In order to turn on or off the first write driver module 242, the second write driver module 243, or the current sink, a switch may be connected. The switch may be implemented by a transmission gate and may be illustrated as ⊕ in FIGS. 5 and 6.

In another example, when the variable resistance element MTJ of target bit cell 231 is in the AP state, in which the data 1 is written, and the data 0 is written in order to change the state of the variable resistance element MTJ of target bit cell 231 from the AP state to the P state, the write current I_WR must be applied from the bit line BL to the source line SL of the variable resistance element MTJ of target bit cell 231. The second write driver module 243 is turned on and current sink in the source line SL is turned on so that a current may be formed from the bit line BL to the source line SL of the target bit cell 231 in accordance with a voltage of the second write driver module 243, which will be described with reference to FIG. 6.

That is, a difference in connection structure between the first write driver module 242 and the second write driver module 243 in FIGS. 5 and 6 may be generated by a difference in target data DIN to be written.

For example, the remaining write driver module excluding the write driver module applying the write current I_WR to the target bit cell 231 may apply the write current I_WR_R to the reference cell 252. The write current I_WR_R applied to the reference cell 252 may be the same as the write current I_WR applied to the target bit cell 231. In addition, a direction of the write current I_WR_R applied to the reference cell 252 may be the same as that of the write current I_WR applied to the target bit cell 231.

Referring to FIGS. 5 and 7, a situation for writing 1 in the variable resistance element MTJ in the P state in which 0 is written will be taken as an example.

The comparator 251 may receive the source line voltage VSL of the target bit cell 231, the source line voltage VSL_REF of the reference cell 252, and the target data DIN.

Because 0 is written in the target bit cell 231, the variable resistance element MTJ may have a lower resistance value. As described in FIG. 2, the reference resistor MTJ_R may have the interval value between the resistance value when the variable resistance element MTJ of the target bit cell 231 is in the P state and the resistance value when the variable resistance element MTJ of the target bit cell 231 is in the AP state. Therefore, the reference resistor MTJ_R may have a resistance value greater than that of the variable resistance element MTJ.

In order to write 1 in the target bit cell 231, the write current I_WR may be generated by the first write driver module 242 and may be applied to the target bit cell 231. On the other hand, the write current I_WR_R may be generated by the second write driver module 243 that is not used for the write operation of the target bit cell 231 and may be applied to the reference cell 252.

The target bit cell 231 and the reference cell 252 may share one write driver module. However, according to some example embodiments, in order to check the data written in the target bit cell 231, without using a separate power source, the write driver 240 in a turn off state may be used.

The source line voltage VSL of the target bit cell 231 may have a value less than that of the source line voltage VSL_REF of the reference cell 252.

The amplifier 2511 of the comparator 251 may amplify first and second input signals VIN and VINB, may transmit the first and second input signals VIN and VINB to the latch circuit 2512, and may output a logic low or high digital signal VOUT based on the first and second input signals VIN and VINB. For example, the logic low may mean −VDD and the logic high may mean +VDD.

For example, the first input signal VIN applied to the amplifier 2511 of the comparator 251 may correspond to the source line voltage VSL of the target bit cell 231 and the second input signal VINB applied to the amplifier 2511 of the comparator 251 may correspond to the source line voltage VSL_REF of the reference cell 252. Because a level of a voltage applied to the source line SL of the target bit cell 231 and the source line SL_REF of the reference cell 252 is low, the source line voltages VSL and VSL_REF may be amplified through the amplifier 2511. Therefore, the source line voltage VSL_REF of the reference cell 252, which is the second input signal VINB, may increase.

Then, the latch circuit 2512 of the comparator 251 may receive first and second output signals VIN2 and VIN2B output from the amplifier 2511 and may output a greater signal between the first and second output signals VIN2 and VIN2B as a complementary metal oxide semiconductor (CMOS) signal or a digital signal. For example, the latch circuit 2512 may output a higher voltage between the amplified source line voltages VSL and VSL_REF as the digital signal VOUT. For example, when a value input to a (+) terminal of the latch circuit 2512 is greater, the latch circuit 2512 may output a +VDD value.

For example, the latch circuit 2512 may output a −VDD value or a logic low value corresponding to a (−) terminal to which the source line voltage VSL_REF of the reference cell 252, which has a large value, is input.

The XOR gate 2513 performs a logic operation, for example, an XOR operation on the output value VOUT of the latch circuit 2512 and the target data DIN and outputs 1 only when the output value VOUT of the latch circuit 2512 is different from the target data DIN. An output value VWRITE of the XOR gate 2513 may control the write driver 240. For example, the write driver 240 may be the first write driver module 242 controlling the write operation of the target bit cell 231.

In the above example, because the XOR gate 2513 may perform the XOR operation on the logic low value and 1 that is the target data DIN and may output 1 because the two values are different from each other. Because the output value VWRITE is 1, the first write driver module 242 may continuously apply the write current I_WR to the target bit cell 231.

When the information written in the target bit cell 231 is different from the target data DIN, the comparator 251 may apply the write current I_WR to the target bit cell 231 through the amplifier 2511, the latch circuit 2512, and the XOR gate 2513 so that the target data DIN is written in the target bit cell 231. The write current I_WR is applied by the write driver module 241. However, because the output value VWRITE of the comparator 251 may flow or block the write current I_WR, the comparator 251 may also control the write current I_WR.

As described above, in FIG. 5, the XOR gate 2513 is used as a logic gate. However, the inventive concepts are not limited thereto and another kind of logic gate or a plurality of logic gates may be used.

Unlike the example of FIG. 5, example embodiments in which the data 0 is previously written in the target bit cell 231 and the target data DIN to be written in the target bit cell 231 is also 0 are taken as examples. At this time, because the resistance value of the variable resistance element MTJ of the target bit cell 231 is less than the resistance value of the reference resistor MTJ_R, the source line voltage VSL of the target bit cell 231, which is input to the comparator 251, may have a value less than that of the source line voltage VSL_REF of the reference cell 252.

Therefore, the output value VOUT of the latch circuit 2512 may be −VDD or logic low. Then, the XOR gate 2513 may perform an XOR operation on the logic low output value VOUT of the latch circuit 2512 and the target data DIN 0 and may output 0 because the two values are equal to each other. Because the output value VWRITE of the comparator 251 is 0, the first write driver module 242 may stop applying the write current I_WR to the target bit cell 231.

Referring to FIGS. 6 and 7, a situation for writing 0 in the variable resistance element MTJ in the AP state in which 1 is written will be taken as an example. Description previously given with reference to FIG. 5 will not be given.

Because 1 is written in the target bit cell 231, the variable resistance element MTJ of the target bit cell 231 may have a larger resistance value. Therefore, the reference resistor MTJ_R may have a resistance value less than that of the variable resistance element MTJ of the target bit cell 231.

In order to write the target data DIN 0 in the target bit cell 231, the write current I_WR may be generated by the second write driver module 243 and may be applied to the target bit cell 231. The write current I_WR_R may be generated by the first write driver module 242 that is not used for the write operation of the target bit cell 231 and may be applied to the reference cell 252.

The bit line voltage VBL of the target bit cell 231 may have a value less than that of the bit line voltage VBL_REF of the reference cell 252.

The first input signal VIN of the amplifier 2511 of the comparator 251 may correspond to the bit line voltage VBL of the target bit cell 231 and the second input signal VINB of the amplifier 2511 of the comparator 251 may correspond to the bit line voltage VBL_REF of the reference cell 252. The amplifier 2511 may amplify the first and second input signals VIN and VINB. Therefore, the bit line voltage VBL of the target bit cell 231 corresponding to the first input signal VIN may further increase. Then, the latch circuit 2512 of the comparator 251 may output a +VDD value or a logic high value corresponding to a (+) terminal to which the bit line voltage VBL of the target bit cell 231, which has a large value, is input.

The XOR gate 2513 of the comparator 251 may perform an XOR operation on the logic high value and 0 and may output 1 because the two values are different from each other. Because the output value VWRITE of the comparator 251 is 1, the second write driver module 243 may continuously apply the write current I_WR to the target bit cell 231.

As described above with reference to FIG. 5, the XOR gate 2513 may be another kind of logic gate or may be implemented by a combination of a plurality of logic gates.

Unlike the example of FIG. 6, example embodiments in which the data 1 is previously written in the target bit cell 231 and the target data DIN to be written in the target bit cell 231 is also 1 are taken as examples. At this time, because the resistance value of the variable resistance element MTJ of the target bit cell 231 is greater than the resistance value of the reference resistor MTJ_R, the bit line voltage VBL of the target bit cell 231, which is input to the comparator 251, may have a value greater than that of the bit line voltage VBL_REF of the reference cell 252.

Therefore, the output value VOUT of the latch circuit 2512 may be +VDD or logic high. Then, the XOR gate 2513 may perform an XOR operation on the logic high output value VOUT of the latch circuit 2512 and the target data DIN 1 and may output 0. Because the output value VWRITE of the comparator 251 is 0, the second write driver module 243 may stop applying the write current I_WR to the target bit cell 231.

According to some example embodiments, when the target data DIN to be written is previously written in the variable resistance element MTJ, because an unnecessary write operation is not performed, consumption of energy used for the write operation may be reduced.

On the other hand, a configuration of the comparator 251 or the reference cell 252 is not limited thereto and may be implemented by a combination of other elements.

Figure 8:
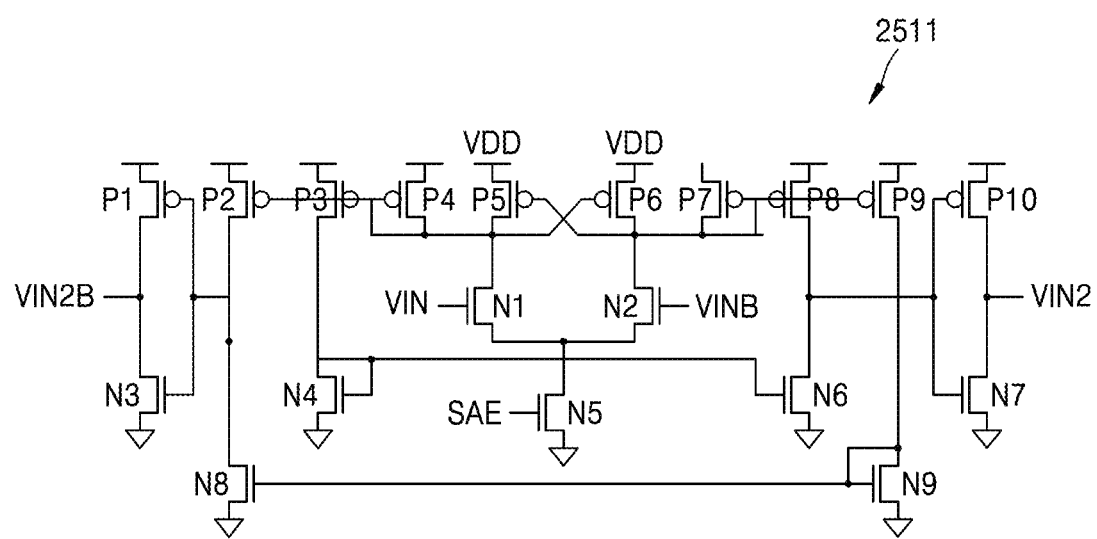
FIGS. 8 and 9 are circuit diagrams illustrating a configuration of a comparator according to example embodiments of the inventive concepts.
Figure 9:
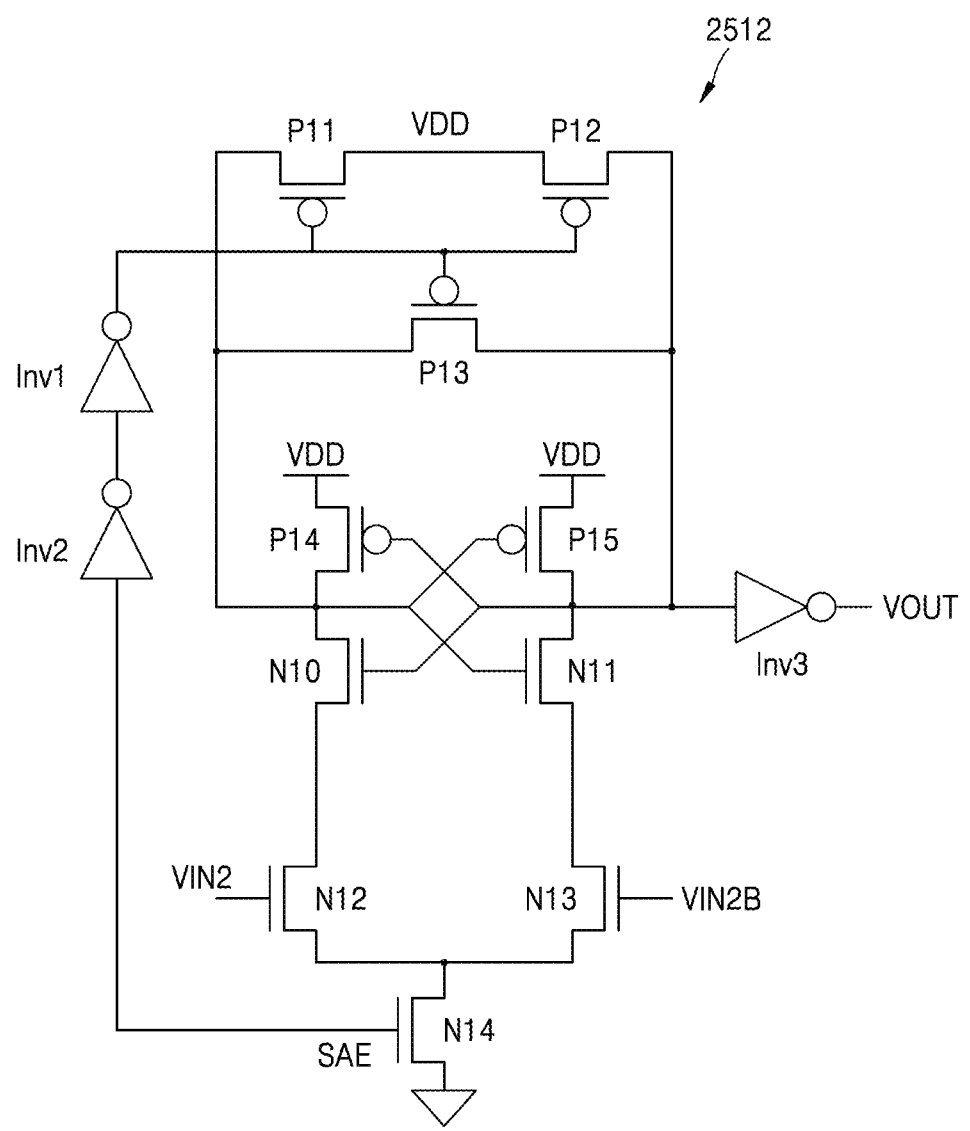

FIGS. 8 and 9 are circuit diagrams illustrating a configuration of a comparator 251 according to example embodiments of the inventive concepts.

Referring to FIG. 8, the amplifier 2511 of the comparator 251 may include first to tenth PMOS transistors P1 to P10 and first to ninth n-channel metal oxide semiconductor (NMOS) transistors N1 to N9.

A power supply voltage VDD may be applied to the fifth PMOS transistor P5 and the sixth PMOS transistor P6 and a sensing enable signal SAE may be applied to a gate of the fifth NMOS transistor N5. The amplifier 2511 may operate in accordance with the sensing enable signal SAE.

For example, as described above with reference to FIG. 5, the source line voltage VSL of the target bit cell 231 and the source line voltage VSL_REF of the reference cell 252 may be applied to a gate of the first NMOS transistor N1 and a gate of the second NMOS transistor N2, respectively. In another example, as described above with reference to FIG. 6, the bit line voltage VBL of the target bit cell 231 and the bit line voltage VBL_REF of the reference cell 252 may be applied to the gate of the first NMOS transistor N1 and the gate of the second NMOS transistor N2, respectively.

The first PMOS transistor P1 and the third NMOS transistor N3 may be connected to a (−) input of the latch circuit 2512. The tenth PMOS transistor P10 and the seventh NMOS transistor N7 may be connected to a (+) input of the latch circuit 2512.

On the other hand, a configuration of the amplifier 2511 is not limited thereto and any configuration amplifying and outputting the first and second input signals VIN and VINB or a combination of other elements may be used.

Referring to FIG. 9, the latch circuit 2512 of the comparator 251 may include 11 to 15 PMOS transistors P11 to P15, tenth to $14^{th}$ NMOS transistors N10 to N14, and first to third inverters Inv1 to Inv3.

The power supply voltage VDD may be applied to the $11^{th}$ PMOS transistor P11, the $12^{th}$ PMOS transistor P12, the $14^{th}$ PMOS transistor P14, and the $15^{th}$ PMOS transistor P15. The sensing enable signal SAE may be applied to a gate of the $14^{th}$ NMOS transistor N14. The latch circuit 2512 may operate in accordance with the sensing enable signal SAE.

The first and second output signals VIN2 and VIN2B of the amplifier 2511 may be applied to the $12^{th}$ NMOS transistor N12 and the $13^{th}$ NMOS transistor N13, respectively.

The latch circuit 2512 may output the output value VOUT through the third inverter Inv3.

On the other hand, a configuration of the latch circuit 2512 is not limited thereto and any configuration in which it is output as a digital signal to which terminal a large voltage value is input or a combination of other elements may be used.

Figure 10A:
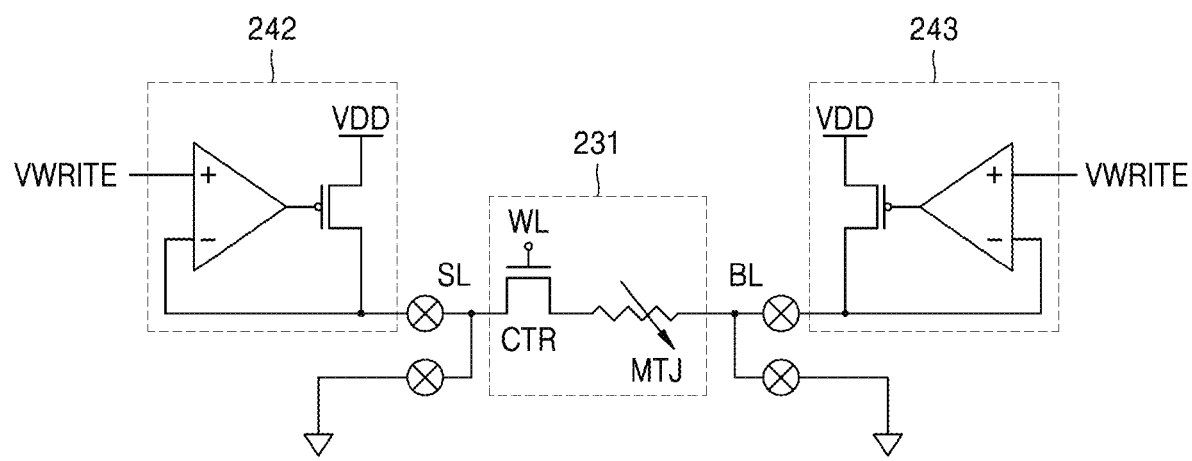
FIGS. 10A to 10C are circuit diagrams illustrating a configuration of a write driver according to example embodiments of the inventive concepts.
Figure 10B:
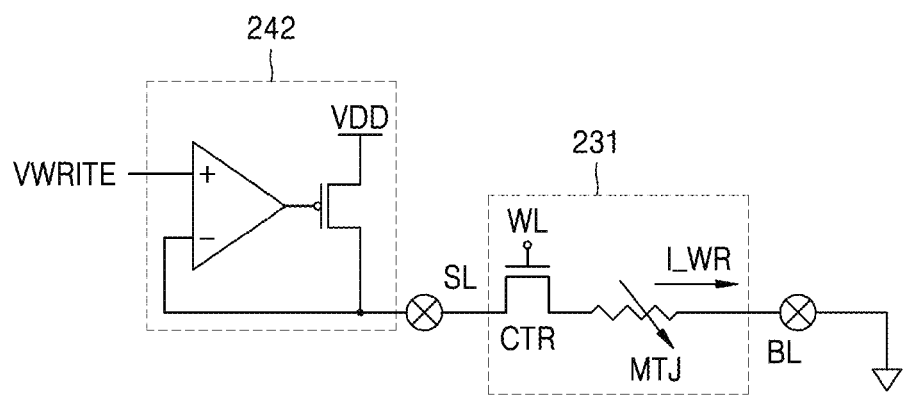
Figure 10C:
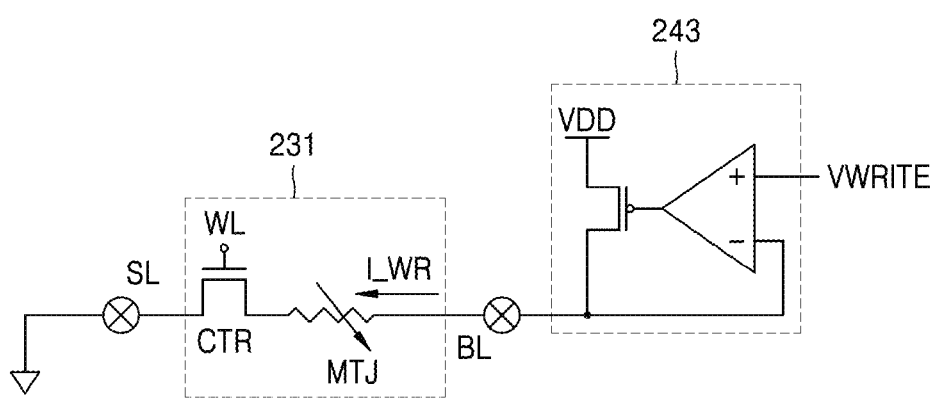

FIGS. 10A to 10C are circuit diagrams illustrating a configuration of a write driver according to example embodiments of the inventive concepts.

Because the write driver according to a comparative example must generate the write current I_WR or a program current enough to change a magnetization direction of the variable resistance element MTJ is reversed, a single NMOS transistor providing a voltage higher than the power supply voltage VDD is used.

In addition, the write driver must apply a voltage within a breakdown voltage of the variable resistance element MTJ. Therefore, the NMOS transistor may drive the target bit cell 231 by a voltage obtained by subtracting a threshold voltage of the NMOS transistor from the output value VWRITE.

When the NMOS transistor is used in order to provide a larger write current and a limited driving voltage, a size of a write driver including the NMOS transistor increases and a write regulator is required as a separate charge pump.

According to some example embodiments, the write driver 240 using a PMOS transistor is disclosed. In addition, in order to reduce or prevent the variable resistance element MTJ from breaking down, an amplifier with a feedback structure may be used together so that the PMOS transistor may not apply all the power supply voltage VDD to the target bit cell 231. The write driver 240 may selectively apply a voltage to the target bit cell 231 in accordance with the output value VWRITE.

Because a path forming a feedback loop is implemented by an amplifier, current consumption may be reduced in comparison with the charge pump generating the output value VWRITE. In addition, because a size of the PMOS transistor is small, the write driver 240 may be implemented in an area less than that of the write driver using the NMOS transistor.

On the other hand, considering that the variable resistance element MTJ is sensitive to a temperature, the output value VWRITE may be compensated by a band-gap voltage reference circuit in accordance with the temperature. The band-gap voltage reference circuit generates an output value that does not change although the temperature changes by feeding back the output voltage generated by using the amplifier. A voltage proportional or inversely proportional to the temperature is offset so that a voltage uniform to the temperature may be output. For example, the output value VWRITE does not have to be a signal generated by the band-gap voltage reference circuit and only has to compensate for the relationship between the driving voltage and the temperature of the variable resistance element MTJ.

Referring to FIG. 10A, the write driver 240 may apply the bidirectional write current I_WR in order to write the data 0 or 1 to the variable resistance element MTJ of the target bit cell 231. In order to apply the bidirectional write current I_WR, the plurality of write driver modules 241 may be connected to the source line SL and the bit line BL of the target bit cell 231.

When one of the plurality of write driver modules 241 is turned on, the remaining write driver modules 241 may be turned off. In some example embodiments, in order to flow the current generated by the plurality of write driver modules 241 to the target bit cell 231, current sink must be turned on at one side of the target bit cell 231. In order to connect the target bit cell 231 to the plurality of write driver modules 241 or to block the target bit cell 231 from the plurality of write driver modules 241, a switch may be used. For example, the transmission gate illustrated in FIG. 10A may be used and may be displayed as ⊗.

For example, referring to FIG. 10B, in order to change the state of the variable resistance element MTJ of target bit cell 231 from the P state to the AP state, the write current I_WR must be applied from the source line SL to the bit line BL. The first write driver module 242 connected to the source line SL is turned on and the current sink connected to the bit line BL is turned on so that the write current I_WR may be generated. In some example embodiments, the current sink connected to the second write driver module 243 and the source line SL may be turned off.

In another example, referring to FIG. 10C, in order to change the state of the variable resistance element MTJ of target bit cell 231 from the AP state to the P state, the write current I_WR must be applied from the bit line BL to the source line SL. The second write driver module 243 connected to the bit line BL is turned on and the current sink connected to the source line SL is turned on so that the write current I_WR may be generated. In some example embodiments, the current sink connected to the first write driver module 242 and the bit line BL may be turned off.

Figure 11:
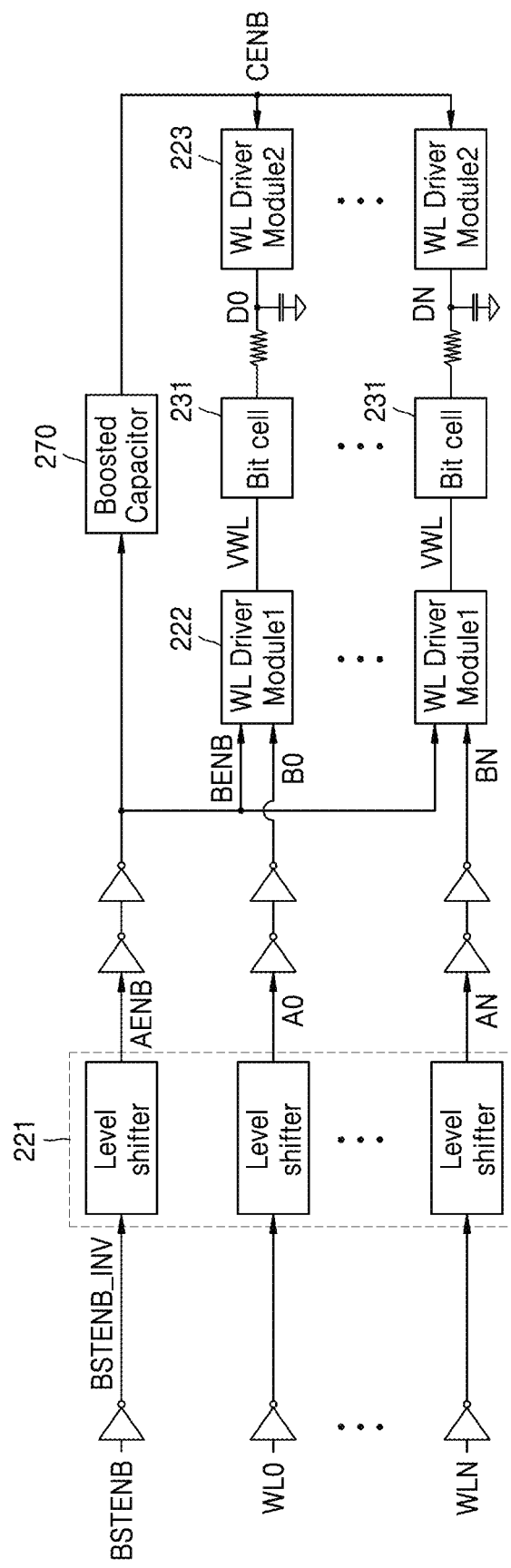
FIG. 11 is a block diagram illustrating a memory device according to example embodiments of the inventive concepts.

FIG. 11 is a block diagram illustrating a memory device according to example embodiments of the inventive concepts.

Referring to FIGS. 3 and 11, the word line driver 220 may be connected to the word line of the target bit cell 231 and may supply a gate drive voltage of the selection transistor CTR of the target bit cell 231.

The word line driver 220 according to some example embodiments may include the plurality of level shifters 221 and the first and second word line driver modules 222 and 223. The plurality of level shifters 221, the first and second word line driver modules 222 and 223, and the boosted capacitor 270 may be connected to the target bit cell 231.

In order to flow a maximum current to the selection transistor CTR of the target bit cell 231, a word line voltage VWL of the target bit cell 231 is applied as a voltage higher than the power supply voltage of the memory device 200. For this purpose, the analog charge pump may be exemplarily used. The analog charge pump previously provides a word line voltage level and performs a switching operation of increasing the word line voltage VWL to a voltage level of the analog charge pump when the write operation is performed. Therefore, in order to previously provide the word line voltage level, power consumption occurs and the plurality of level shifters 221 are required for the word line driver 220 due to the switching operation of the word line voltage VWL.

The word line driver 220 according to example embodiments of the inventive concepts may receive an address signal at a low voltage from the row decoder 210 and may increase a level of the voltage of the address signal to a VDD_H level through the plurality of level shifters 221. The VDD_H level may be higher than a VDD level. For example, VDD_H may be VDD18. Then, through the first and second word line driver modules 222 and 223 and the boosted capacitor 270, the word line voltage VWL at a level higher than the VDD_H level may be provided to the both ends of the target bit cell 231.

A series of operations of the word line driver 220 and the boosted capacitor 270 according to example embodiments of the inventive concepts may be referred to as a word line voltage boosting operation.

In order to boost the word line voltage VWL, one of the plurality of level shifters 221 may receive a first control signal BSTENB_INV, may increase a level of the first control signal BSTENB_INV from the VDD level to the VDD_H level, and may output a second control signal AENB.

Then, the first and second word line driver modules 222 and 223 and the boosted capacitor 270 may receive a third control signal BENB.

The plurality of word lines WL0 to WLN may be connected to the plurality of level shifters 221, respectively. One of the plurality of level shifters 221 may receive the first control signal BSTENB_INV and may output the second control signal AENB. The first control signal BSTENB_INV may be obtained by inverting the word line signal generated by the row decoder 210.

The level shifter 221 may be connected to the word line WL of the target bit cell 231, may receive the word line selection voltage, and may output a voltage higher than the power supply voltage of the memory device 200.

The first word line driver module 222 may make a pair with the second word line driver module 223. For example, the first word line driver module 222 and the second word line driver module 223 may be connected to the both ends of the target bit cell 231, respectively.

The first word line driver module 222 may receive the third control signal BENB and may provide the word line voltage VWL to the target bit cell 231.

The second word line driver module 223 may receive a fourth control signal CENB output from the boosted capacitor 270 and may output a fifth control signal DO.

For example, the first word line driver module 222 and the second word line driver module 223 may be connected to the boosted capacitor 270.

The first word line driver module 222 and the second word line driver module 223 may provide the voltage higher than the voltage output from the level shifter 221 to the word line WL of the target bit cell 231.

One end of the boosted capacitor 270 may be connected to the level shifter 221 and the first word line driver module 222 and the other end of the boosted capacitor 270 may be connected to the second word line driver module 223.

The boosted capacitor 270 may control a capacitance value in accordance with at least one of temperatures of the memory device 200, the memory cell array 230, and the variable resistance element MTJ of the target bit cell 231. Therefore, in order to compensate for the voltage feature of the variable resistance element MTJ sensitive to the temperature, the boosted capacitor 270 may be used.

The boosted capacitor 270 according to some example embodiments may be used for compensating for the feature of the variable resistance element MTJ of which driving voltage varies in accordance with the temperature together with the band-gap voltage reference circuit described with reference to FIGS. 10A-10C. A configuration of the boosted capacitor 270 will be described with reference to FIG. 15.

On the other hand, configurations or arrangements of the plurality of level shifters 221, the first and second word line driver modules 222 and 223, and the boosted capacitor 270 are not limited thereto.

Figure 12:
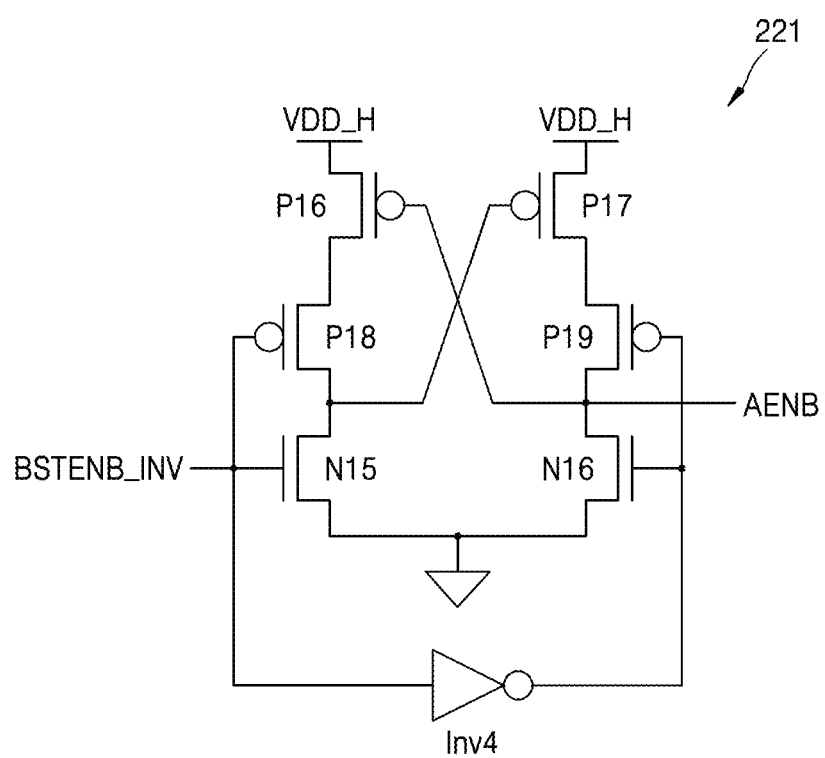
FIG. 12 is a circuit diagram illustrating a configuration of a level shifter according to example embodiments of the inventive concepts.

FIG. 12 is a circuit diagram illustrating a configuration of a level shifter 221 according to example embodiments of the inventive concepts.

Referring to FIGS. 11 and 12, the level shifter 221 may be connected to the word lines WL0 to WLN. In FIG. 12, the level shifter 221 receiving the first control signal BSTENB_INV will be illustrated.

The level shifter 221 may include $16^{th}$ to $19^{th}$ PMOS transistors P16 to P19, $15^{th}$ and $16^{th}$ NMOS transistors N15 and N16, and a fourth inverter Inv4.

The $16^{th}$ PMOS transistor P16 and the $17^{th}$ PMOS transistor P17 may be connected to power supply voltages VDD_H. The $18^{th}$ PMOS transistor P18, the $15^{th}$ NMOS transistor N15, and the fourth inverter Inv4 may receive the first control signal BSTENB_INV.

The $19^{th}$ PMOS transistor P19 and the $16^{th}$ NMOS transistor N16 may output the second control signal AENB.

The level shifter 221 may amplify the first control signal BSTENB_INV by the power supply voltages VDD_H of the level shifter 221. For example, when a logic high level of the first control signal BSTENB_INV is 1.0 V, a logic high level of the second control signal AENB that is the output signal of the level shifter 221 may be 1.8 V.

For example, the power supply voltages VDD_H illustrated in FIG. 12 may have any value greater than the value of the power supply voltage VDD illustrated in FIGS. 8 to 10.

Figure 13:
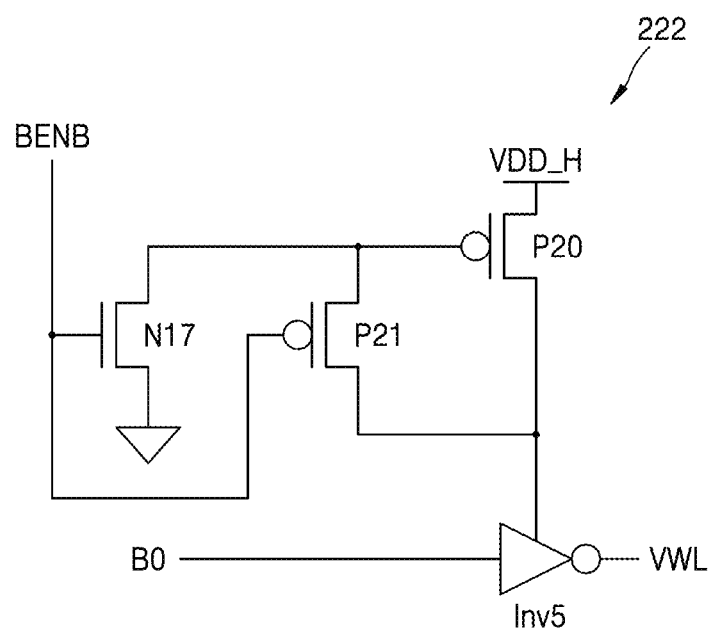
FIGS. 13 and 14 are circuit diagrams illustrating a configuration of a word line driver module according to example embodiments of the inventive concepts.
Figure 14:
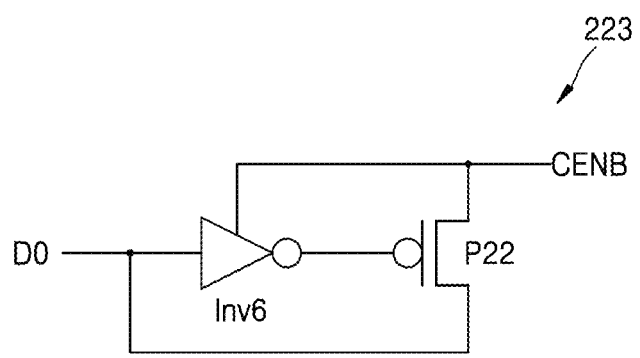

FIGS. 13 and 14 are circuit diagrams illustrating a configuration of a word line driver module according to example embodiments of the inventive concepts.

Referring to FIG. 13, the first word line driver module 222 may include $20^{th}$ and $21^{st}$ PMOS transistors P20 and P21, the $17^{th}$ NMOS transistor N17, and a fifth inverter Inv5.

The $20^{th}$ PMOS transistor P20 may be connected to the power supply voltage VDD_H. The $21^{st}$ PMOS transistor P21 and the $17^{th}$ NMOS transistor N17 may receive the third control signal BENB. The fifth inverter Inv5 may receive a fifth control signal BO and may output the word line voltage VWL of the target bit cell 231.

Referring to FIG. 14, the second word line driver module 223 may include a $22^{nd}$ PMOS transistor P22 and an inverter Inv6. The $22^{nd}$ PMOS transistor P22 may receive the fourth control signal CENB and a sixth control signal DO. The sixth inverter Inv6 may receive the sixth control signal DO.

Figure 15:
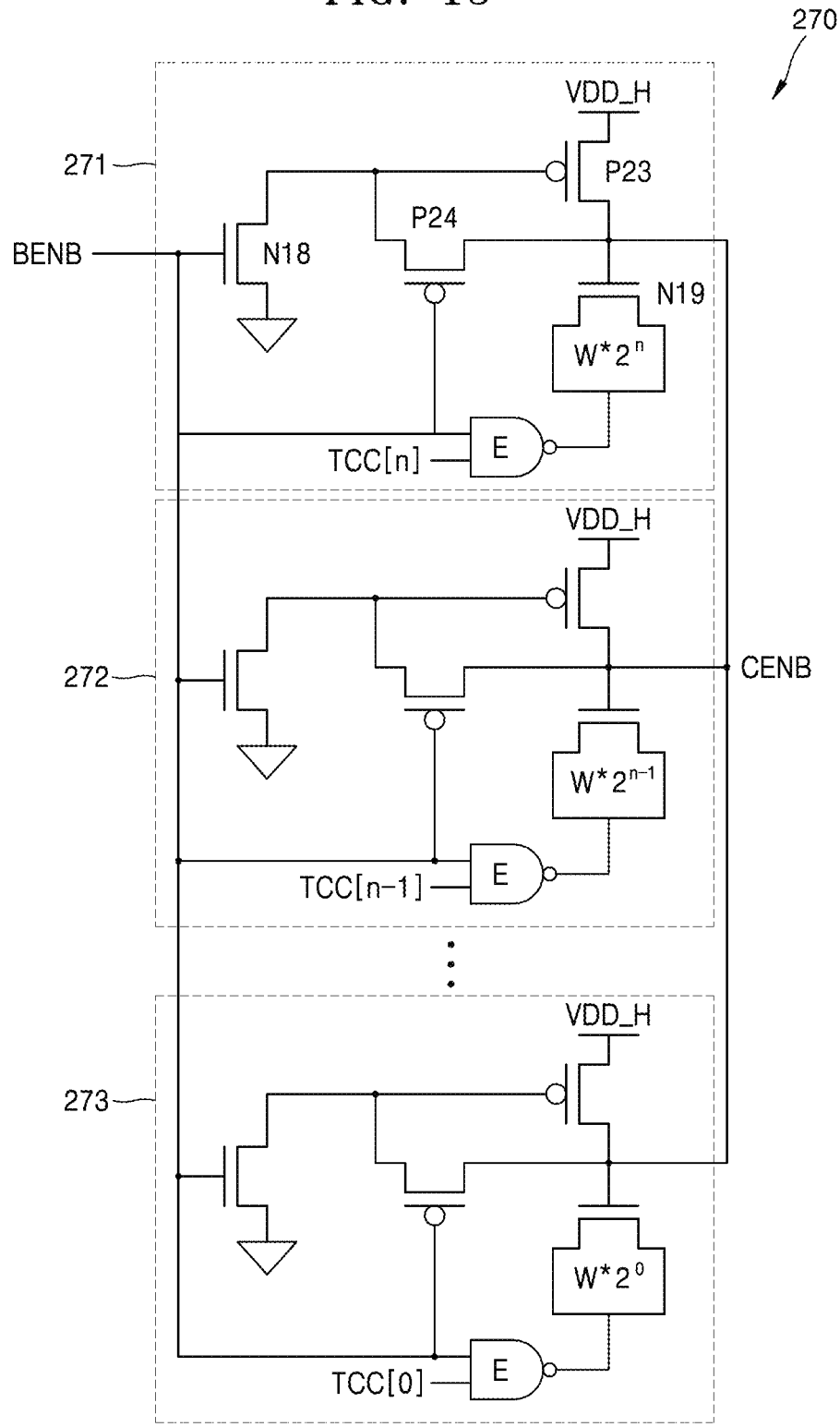
FIG. 15 is a circuit diagram illustrating a configuration of a boosted capacitor according to example embodiments of the inventive concepts.

FIG. 15 is a circuit diagram illustrating a configuration of a boosted capacitor according to example embodiments of the inventive concepts.

Referring to FIG. 15, the boosted capacitor 270 may include a plurality of capacitor modules 271, 272, and 273 connected to one another and may control the capacitance value in accordance with the temperature. As the capacitance value of the boosted capacitor 270 is controlled, a magnitude of the word line voltage VWL provided to the target bit cell 231 may vary.

For example, the boosted capacitor 270 may receive the TCC from a separate temperature sensing module (not shown) capable of sensing the temperature and may activate a specific number of capacitor modules 271, 272, and 273.

The temperature sensing module may sense at least one of the temperatures of the memory device 200, the memory cell array 230, and the variable resistance element MTJ of the target bit cell 231 and may generate the TCC for changing the word line voltage VWL to be provided to the target bit cell 231.

For example, the TCC may be a binarized value of n+1 bits. The plurality of capacitor modules 271, 272, and 273 may be turned on or off in accordance with the bit value.

Each of the plurality of capacitor modules 271, 272, and 273 may include $23^{rd}$ and 24th PMOS transistors, $18^{th}$ and $19^{th}$ NMOS transistors, and a NAND gate.

When one capacitor module 271 is taken as an example, the $18^{th}$ NMOS transistor N18 may receive the third control signal BENB. The $23^{rd}$ PMOS transistor P23 may receive the power supply voltage VDD_H and may output the fourth control signal CENB.

The NAND gate may receive a voltage of a node and a specific bit of the binarized TCC. The NAND gate may output 0 only when the voltage of the third control signal BENB is at a logic high level and the bit value of the TCC is 1.

One or more of the elements disclosed above may include or be implemented in one or more processing circuitries such as hardware including logic circuits; a hardware/software combination such as a processor executing software; or a combination thereof. For example, the processing circuitries more specifically may include, but are not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A resistive memory device comprising:
a resistive memory cell connected between a first bit line and a first source line;
a reference cell including a reference resistor and connected between a second bit line and a second source line;
a write driver connected to the first bit line or the first source line, connected to the second bit line or the second source line, and configured to generate a write current for writing target data in the resistive memory cell;
a level shifter connected to a word line of the resistive memory cell and configured to receive a word line selection voltage and output a first voltage higher than a power supply voltage of the resistive memory device,
a word line driver including a first word line driver module connected to the first source line and a second word line driver module connected to the first bit line and configured to provide a second voltage higher than the first voltage to the word line of the resistive memory cell; and
a boosted capacitor having one end connected to the level shifter and the first word line driver module and another end connected to the second word line driver module,
wherein the write driver comprises a comparator configured to receive the write current, compare previous data written in the resistive memory cell with the target data by comparing a voltage of the first source line with a voltage of the second source line or compare a voltage of the first bit line with a voltage of the second bit line, and determine whether the target data is written in the resistive memory cell in accordance with a result of comparing the previous data with the target data.

2. The resistive memory device of claim 1, wherein the write driver is further configured not to write the target data in the resistive memory cell when the previous data is the same as the target data and write the target data in the resistive memory cell when the previous data is different from the target data.

3. The resistive memory device of claim 2, wherein the comparator is further configured to control an output of the write current in accordance with whether the previous data is the same as the target data.

4. The resistive memory device of claim 3, wherein the comparator is further configured to block the write current flowing through the resistive memory cell when the previous data is the same as the target data and apply the write current to the resistive memory cell when the previous data is different from the target data.

5. The resistive memory device of claim 1, wherein the comparator comprises:
an amplifier configured to receive the first source line voltage and the second source line voltage or the first bit line voltage and the second bit line voltage;
a latch circuit configured to receive output values of the amplifier; and
a logic gate configured to receive an output value of the latch circuit and the target data.

6. The resistive memory device of claim 1, wherein the write driver comprises a first write driver module and a second write driver module, and
wherein the first write driver module and the second write driver module are each configured to selectively operate in accordance with the target data.

7. The resistive memory device of claim 6, wherein the first write driver module is further configured to supply the write current to the resistive memory cell, and
wherein the second write driver module is further configured to supply a current to the reference cell.

8. The resistive memory device of claim 6, wherein each of the first and second write driver modules comprises a PMOS transistor and an amplifier connected to each other via a feedback structure.

9. The resistive memory device of claim 1, wherein the reference cell further comprises a selection transistor, and
wherein a reference resistance value is an interval value between a resistance value in a state in which data of the resistive memory cell is 1 and a resistance value in a state in which data of the resistive memory cell is 0.

10. The resistive memory device of claim 1, wherein a driving feature of the resistive memory cell varies in accordance with a temperature, and
wherein a capacitance value of the boosted capacitor varies in order to compensate for the driving feature of the resistive memory cell in accordance with the temperature.

11. The resistive memory device of claim 10, wherein the boosted capacitor comprises a plurality of capacitor modules connected to one another in accordance with binarized temperature information.

12. The resistive memory device of claim 1, wherein the resistive memory device is magnetic random access memory (MRAM).

13. An operating method of a resistive memory device, the operating method comprising:
receiving a write command for writing target data in a resistive memory cell connected between a first bit line and a first source line from a memory controller;
generating a write current in accordance with the write command;
activating a word line in the resistive memory cell by outputting a word line driving voltage from a level shifter connected to the word line, the word line driving voltage being higher than a power supply voltage of the resistive memory device;
receiving the write current and comparing previous data written in the resistive memory cell with the target data by comparing a voltage of the first source line with a voltage of a second source line or comparing a voltage of the first bit line with a voltage of a second bit line;
determining whether the target data is written in the resistive memory cell in accordance with a result of comparing the previous data with the target data;
outputting control signals to a pair of word line drivers connected to the memory cell; and
controlling at least one control signal of the control signals, the at least one control signal being output to a word line driver of the pair of word line drivers, the at least one control signal being controlled by a boosted capacitor configured to compensate for a variable resistance in the resistive memory cell,
wherein the second source line is a source line of a reference cell including a reference resistor and the second bit line is a bit line of the reference cell.

14. The operating method of claim 13, wherein a reference resistance value is an interval value between a resistance value in a state in which data of the resistive memory cell is 1 and a resistance value in a state in which data of the resistive memory cell is 0.

15. The operating method of claim 13, wherein, in the determining whether the target data is written in the resistive memory cell in accordance with the result of comparing the previous data with the target data, the target data is not written in the resistive memory cell when the previous data is the same as the target data and is written in the resistive memory cell when the previous data is different from the target data.

16. A resistive memory device comprising:
a level shifter connected to a word line of a resistive memory cell connected between a first bit line and a first source line, and configured to receive a word line selection voltage, and output a first voltage higher than a power supply voltage of the resistive memory device;
a word line driver including a first word line driver module connected to the first source line and a second word line driver module connected to the first bit line and configured to provide a second voltage higher than the first voltage to a word line of the resistive memory cell; and
a boosted capacitor having one end connected to the level shifter and the first word line driver module and another end connected to the second word line driver module.

17. The resistive memory device of claim 16, wherein a driving feature of the resistive memory cell varies in accordance with a temperature, and
wherein a capacitance value of the boosted capacitor varies in order to compensate for the driving feature of the resistive memory cell in accordance with the temperature.

18. The resistive memory device of claim 17, wherein the boosted capacitor comprises a plurality of capacitor modules connected to one another in accordance with binarized temperature information.

19. The resistive memory device of claim 16, further comprising:
a reference cell including a reference resistor and connected between a second bit line and a second source line; and
a write driver connected to the first bit line or the first source line, connected to the second bit line or the second source line, and configured to generate a write current for writing target data in the resistive memory cell,
wherein the write driver comprises a comparator configured to receive the write current, compare previous data written in the resistive memory cell with the target data by comparing a voltage of the first source line with a voltage of the second source line or by comparing a voltage of the first bit line with a voltage of the second bit line, and determine whether the target data is written in the resistive memory cell in accordance with a result of comparing the previous data with the target data, and
wherein the target data is not written in the resistive memory cell when the previous data is the same as the target data and is written in the resistive memory cell when the previous data is different from the target data.

* * * * *